United States Patent
Blodgett

(10) Patent No.: US 6,434,067 B1
(45) Date of Patent: Aug. 13, 2002

(54) SEMICONDUCTOR MEMORY HAVING MULTIPLE REDUNDANT COLUMNS WITH OFFSET SEGMENTATION BOUNDARIES

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/955,072

(22) Filed: Sep. 19, 2001

Related U.S. Application Data

(63) Continuation of application No. 09/695,986, filed on Oct. 26, 2000, now Pat. No. 6,307,195, which is a continuation of application No. 09/354,304, filed on Jul. 16, 1999, now Pat. No. 6,163,489.

(51) Int. Cl.[7] .................................................. G11C 7/00
(52) U.S. Cl. ....................................... 365/200; 365/210
(58) Field of Search ............................... 365/200, 210, 365/51, 63, 230.03, 230.04

(56) References Cited

U.S. PATENT DOCUMENTS

| | | |
|---|---|---|
| 3,845,476 A | 10/1974 | Boehm |
| 5,163,023 A | 11/1992 | Ferris et al. |
| 5,257,229 A | 10/1993 | McClure et al. |
| 5,315,541 A | 5/1994 | Harari et al. |
| 5,608,678 A | 3/1997 | Lysinger |
| 5,706,292 A | 1/1998 | Merritt |
| 5,742,547 A | 4/1998 | Lee |
| 6,314,030 B1 * | 11/2001 | Keeth .......................... 365/200 |

* cited by examiner

*Primary Examiner*—Richard Elms
*Assistant Examiner*—Anh Phung
(74) *Attorney, Agent, or Firm*—Dickstein Shapiro Morin & Oshinsky LLP

(57) ABSTRACT

A memory device with a segmented column architecture that allows for single bank repair across any two row blocks is disclosed. Multiple redundant columns are provided that have offset segment boundaries, i.e., a first redundant column is divided into four segments consisting of row block <0,1>, row block <2,3>, row block <4,5> and row block <6,7>, and a second redundant column is divided into four segments consisting of row block <1,2>, row block <3,4>, row block <5,6> and row block <0,7>. By offsetting the segment boundaries, the repair of the memory device can be optimized by repairing any two adjacent row blocks with only one column segment by selecting the appropriate redundant column segment.

8 Claims, 9 Drawing Sheets

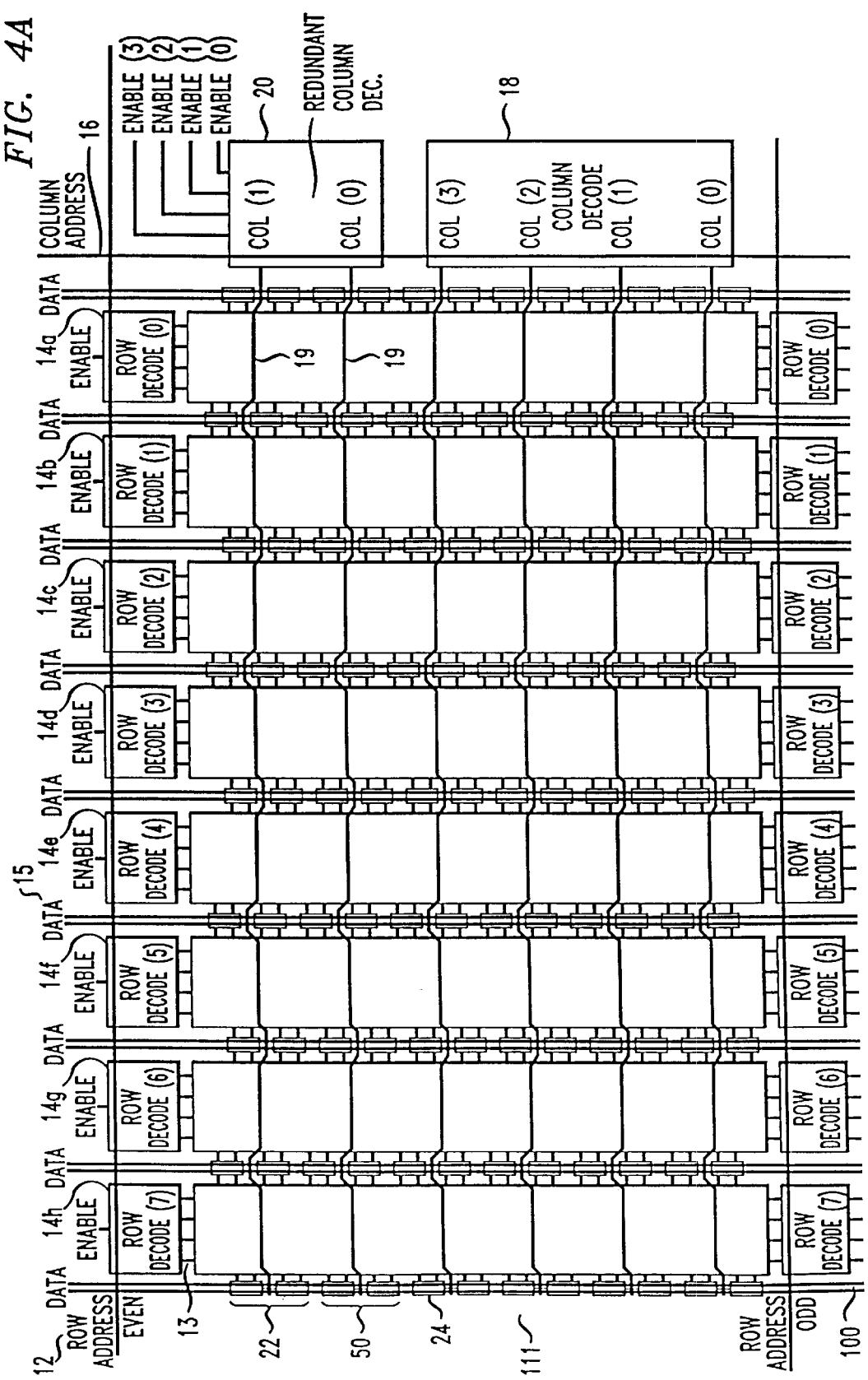

SEMICONDUCTOR MEMORY HAVING MULTIPLE REDUNDANT COLUMNS WITH OFFSET SEGMENTATION BOUNDARIES

This application is a continuation of U.S. patent application Ser. No. 09/695,986, filed Oct. 26, 2000 now U.S. Pat. No. 6,307,195, which is a continuation of U.S. patent application Ser. No. 09/354,304 filed Jul. 16, 1999 (issued as U.S. Pat. No. 6,163,489 on Dec. 19, 2000), the entirety of each of which is incorporated herein by reference.

BACKGROUND OF THE INVENTION

1. Field of the Invention

The present invention relates generally to integrated circuit memory devices, and more particularly to a memory device having multiple redundant columns with offset segmentation boundaries.

2. Description of the Related Art

Memory tests on semiconductor devices, such as random access memory (RAM) integrated circuits, e.g., DRAMs, SRAMs and the like, are typically performed by the manufacturer during production and fabrication to locate defects and failures in such devices that can occur during the manufacturing process of the semiconductor devices. Defects may be caused by a number of factors, including particle defects such as broken or shorted out columns and rows, particle contamination, or bit defects. The testing is typically performed by a memory controller or processor (or a designated processor in a multi-processor machine) which runs a testing program, often before a die containing the semiconductor device is packaged into a chip.

Random access memories are usually subjected to data retention tests and/or data march tests. In data retention tests, every cell of the memory is written and checked after a pre-specified interval to determine if leakage current has occurred that has affected the stored logic state. In a march test, a sequence of read and/or write operations is applied to each cell, either in increasing or decreasing address order. Such testing ensures that hidden defects will not be first discovered during operational use, thereby rendering end-products unreliable. In order to reduce the number of address lines and time required to conduct a memory test, the memory tests may be done in a compressed mode in which multiple banks of memory locations are tested in parallel rather than one at a time.

Many semiconductor devices, particularly memory devices, include redundant circuitry on the semiconductor device that can be employed to replace malfunctioning circuits found during testing. During the initial testing of a memory device, defective elements are repaired by replacing them with non-defective elements referred to as redundant elements. By enabling such redundant circuitry, the device need not be discarded even if it fails a particular test. FIG. 1 illustrates one memory bank 11 of a memory array 10 of a conventional memory device. Memory bank 11 includes a plurality of memory cells arranged in rows and columns. The architecture of memory bank 11 illustrated in FIG. 1 divides the rows into eight row blocks, numbered row block <0> to row block <7>. It should be understood that the eight row blocks illustrated in FIG. 1 are exemplary only, and a memory device is not limited to eight row blocks. It should also be understood that FIG. 1 illustrates only a portion of array 10 of a memory device. Array 10 may be provided with a plurality of memory banks. Additionally, a mirror image memory bank of the memory bank 11 is typically provided located to the right of column decoder 18 and redundant column decoder 20.

A memory cell is accessed by applying a specific row address on row address lines 12 to the row decoders 14a–14h and a column address on column address lines 16 to column decoder 18 and redundant column decoder 20. Row decoders 14a–14h will activate the selected cell row via one of the row lines 13, while column decoder 18 and redundant column decoder 20 will activate the selected cell column via one of the column lines 19.

A redundant column 22 spans the eight row blocks <0> to <7>. Memory devices typically employ redundant rows and columns of memory cells so that if a memory cell in a column or row of the primary memory array is defective, then an entire column or row of redundant memory cells can be substituted therefore. It should be noted that while only one redundant column is depicted, a typical modern high density memory device may have more than one redundant column and may also be provided with redundant rows as well. Substitution of one or more of the spare rows or columns is conventionally accomplished by opening a specific combination of fuses (not shown) or closing antifuses in one of several fuse banks (not shown) on the die. A selected combination of fuses are blown to provide an address equal to the address of the defective cell. For example, if the defective cell has an eight-bit binary address of 11011011, then the third and sixth fuses in a set of eight fuses within one of several fuse banks will be blown, thereby storing this address. A compare circuit (not shown) compares each incoming address to the blown fuse addresses stored in the fuse banks to determine whether the incoming address matches with one of the blown fuse addresses. If the compare circuit determines a match, then it outputs a match signal (typically one bit-). In response thereto, the column decoder 18 is disabled and the redundant column decoder 20 is activated to access the redundant column 22. A plurality of sense amplifiers 24 are provided adjacent to each row block to read the data from a selected cell and output it to one of the data lines 15.

The columns of redundant memory cells necessarily occupy space on the die. Therefore, it is desirable to obtain the maximum number of repairs using a minimum number of spare columns. One conventional way to increase the effectiveness of a redundant column is to segment the redundant column. By segmenting the redundant columns, a defective memory cell in a region of the primary memory array can be repaired with only a portion of the redundant column. For example, the redundant column 22 can be segmented into four regions, Segment <0> to Segment <3>, as illustrated in FIG. 2. A fuse bank (not shown) is associated with each bank to store the column address. Only one of the four segments will be selected to compare the applied address with the address stored in the selected redundant column fuse bank. The column segment selected is determined by which row block, i.e., row block <0> to <7> is enabled by one of row decoders 14a–14h. Typically, the most significant bits (MSBs) of the row address are used to select one of the four segments for the comparison, i.e., MSBs 00 would select Segment <0>, MSBs 01 would select Segment <1>, MSBs 10 would select Segment <2>, and MSBs 11 would select Segment <3>.

By segmenting the redundant column, a defective memory cell in the primary memory array can be repaired with only a portion of the redundant column, i.e., only one segment of the redundant column. Thus, a second defective memory cell can be repaired using a second segment of the redundant column, a third defective memory cell can be repaired using a third segment of the redundant column, and a fourth defective memory cell can be repaired using a fourth segment of the redundant column. This technique allows for a greater number of single bit errors to be repaired utilizing only a single physical redundant column, instead of having to utilize an entire column for each defective cell. Thus, the area on the die required for redundant columns can be significantly reduced.

Another advantage of segmenting the columns is that address compression test modes can be implemented such that compressed addresses do not cross redundancy planes. For example, four redundant column circuits might each have a single fuse bank. A memory array is connected to each of the four redundant column circuits. Only one of the circuits will be active at a time based on which row block is enabled. If the selected redundant column circuit detects a column address match, the redundant column is turned on in all four of the memory arrays. In this manner, each of the four redundant column circuits controls one segment of the physical redundant column in all four memory arrays. In address compression test mode, address bits which are used to select one of the four memory arrays can be compressed out, i.e., made "don't cares." All four memories can be accessed together, the data logically combined, and read out on a single input/output pin. If a defective cell is detected, a redundant column may be used to repair the device without regard for which of the memory arrays actually contains the defective memory cell, since all four arrays are repaired by the redundant column. By utilizing the address compression test mode, the time required for the testing can be reduced, thus increasing throughput.

There are drawbacks, however, with the segmentation approach described above. Although the segmentation of the redundant column allows for multiple repairs using a single column, under certain conditions the segmented column may not be used as efficiently as possible and memory cells which are not defective may be unnecessarily repaired. For example, some circuit defects can effect the digit lines of an adjacent row block that shares a sense amplifier with the defective circuit and thereby cause failures in the adjacent row block. This is due to the isolation and equilibrate devices, as are known in the art for memory devices, which are turned on when the array is inactive. FIG. 3 illustrates in greater detail the portion 30 designated by the dashed lines of memory bank 11 illustrated in FIG. 1. The digit lines 32, 34 of a memory device are typically designed to equilibrate to a particular reference voltage when the array is idle. When the isolation lines 36 are on, transistors 38, 38a, 40 and 40a are switched on, causing the digit lines from adjacent row blocks to be electrically connected through sense amplifier 24, i.e., digit lines 32 and 32a are connected and digit lines 34 and 34a are connected.

If a memory defect causes the digit lines to achieve an incorrect equilibrated potential, then the sense amplifier may not be able to detect the data stored in a selected memory cell during a read cycle. For example, a defect in memory cell 42 of row block <3> could cause digit line 32 to equilibrate to a ground potential rather than the required reference potential. Since digit line 32 shares sense amplifier 24 with digit line 32a in row block <4>, digit line 32a may also equilibrate to a ground potential. If this occurs, then two redundant column segments will need to be programmed to repair the device. The first redundant column segment, i.e., Segment <1> of FIG. 2, will replace segments of the column for row blocks <2> and <3>, and a second column segment, i.e., Segment <2> of FIG. 2, will replace segments of the column for row blocks <4> and <5>. Thus, row blocks <3> and <4> will be repaired. However, two fuse banks have been used, one for each redundant column segment, and row blocks <2> and <5> have been repaired unnecessarily, reducing the efficiency of the redundant column.

Thus, there exists a need for a segmented column architecture that provides the benefits of increased single bit repair, address compression compatibility, and single bank repair across any two row blocks.

SUMMARY OF THE INVENTION

The present invention overcomes the problems associated with the prior art and provides a segmented column architecture that maintains the benefits of increased single bit repair, address compression compatibility, and allows for single bank repair across any two row blocks.

In accordance with the present invention, multiple redundant columns are provided that have offset segment boundaries, i.e., a first redundant column is divided into four segments consisting of row block <0,1>, row block <2,3>, row block <4,5> and row block <6,7>, and a second redundant column is divided into four segments consisting of row block <1,2>, row block <3,4>, row block <5,6> and row block <0,7>. By offsetting the segment boundaries, the repair can be optimized by repairing any two adjacent row blocks with only one column segment by selecting the appropriate redundant column segment. The segment boundaries can either be set into the redundant columns or programmed into redundant columns.

These and other advantages and features of the invention will become more readily apparent from the following detailed description of the invention which is provided in connection with the accompanying drawings.

BRIEF DESCRIPTION OF THE DRAWINGS

FIG. 4 illustrates a portion of a memory device having multiple offset redundant columns in accordance with the present invention;

DETAILED DESCRIPTION OF THE PREFERRED EMBODIMENTS

Figure 1:
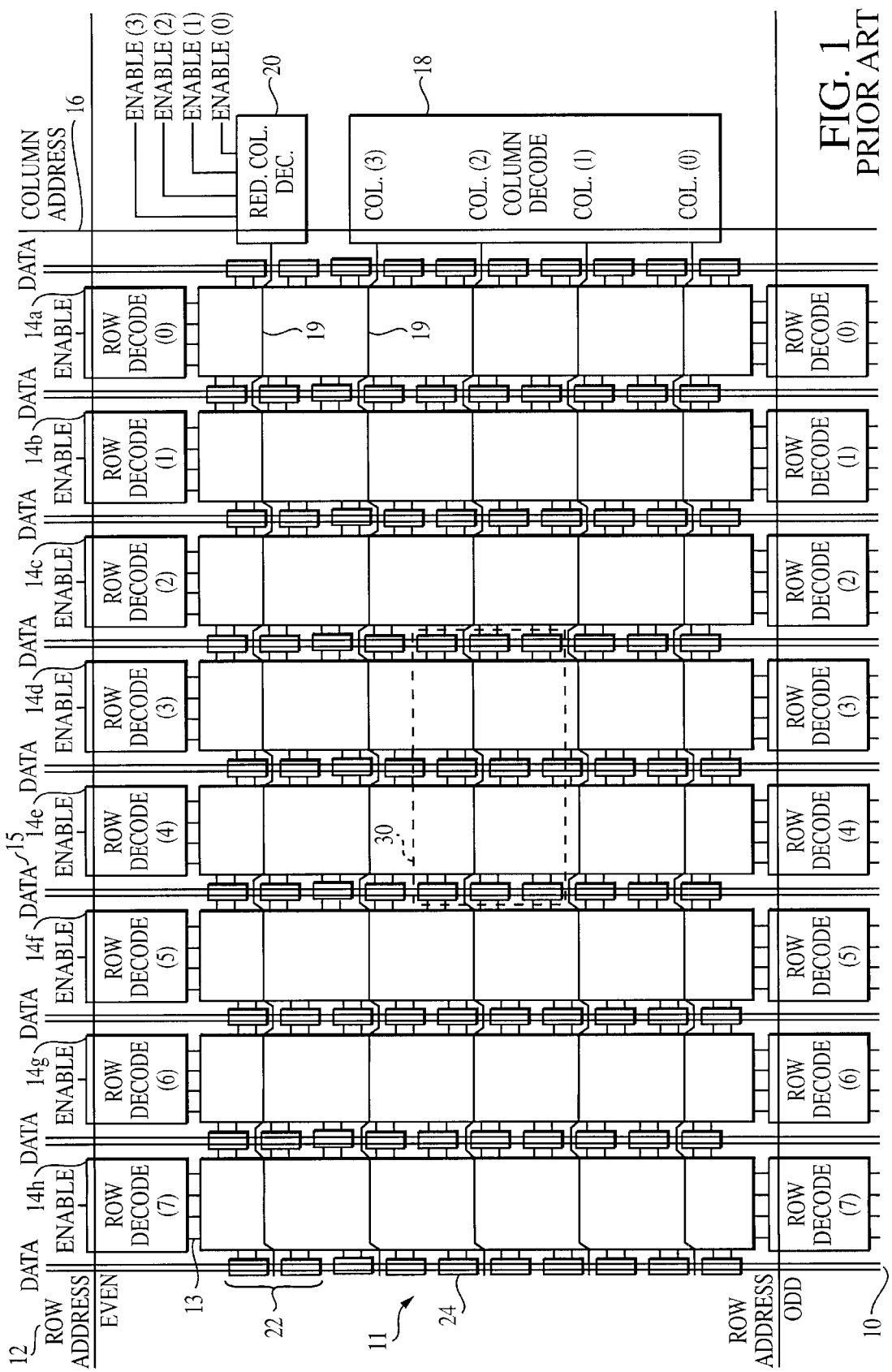
FIG. 1 illustrates an exemplary memory bank of a conventional memory array.
Figure 2:
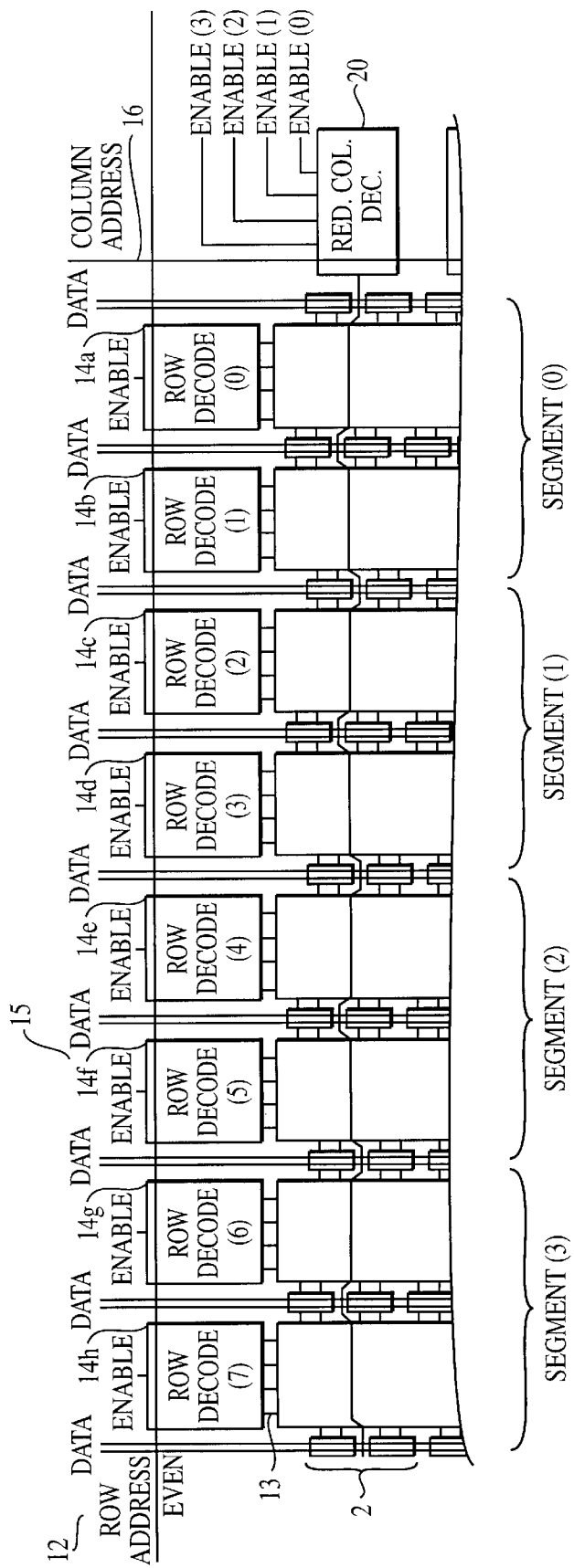
FIG. 2 illustrates conventional segmentation of the redundant column from the memory bank of FIG. 1.
Figure 3:
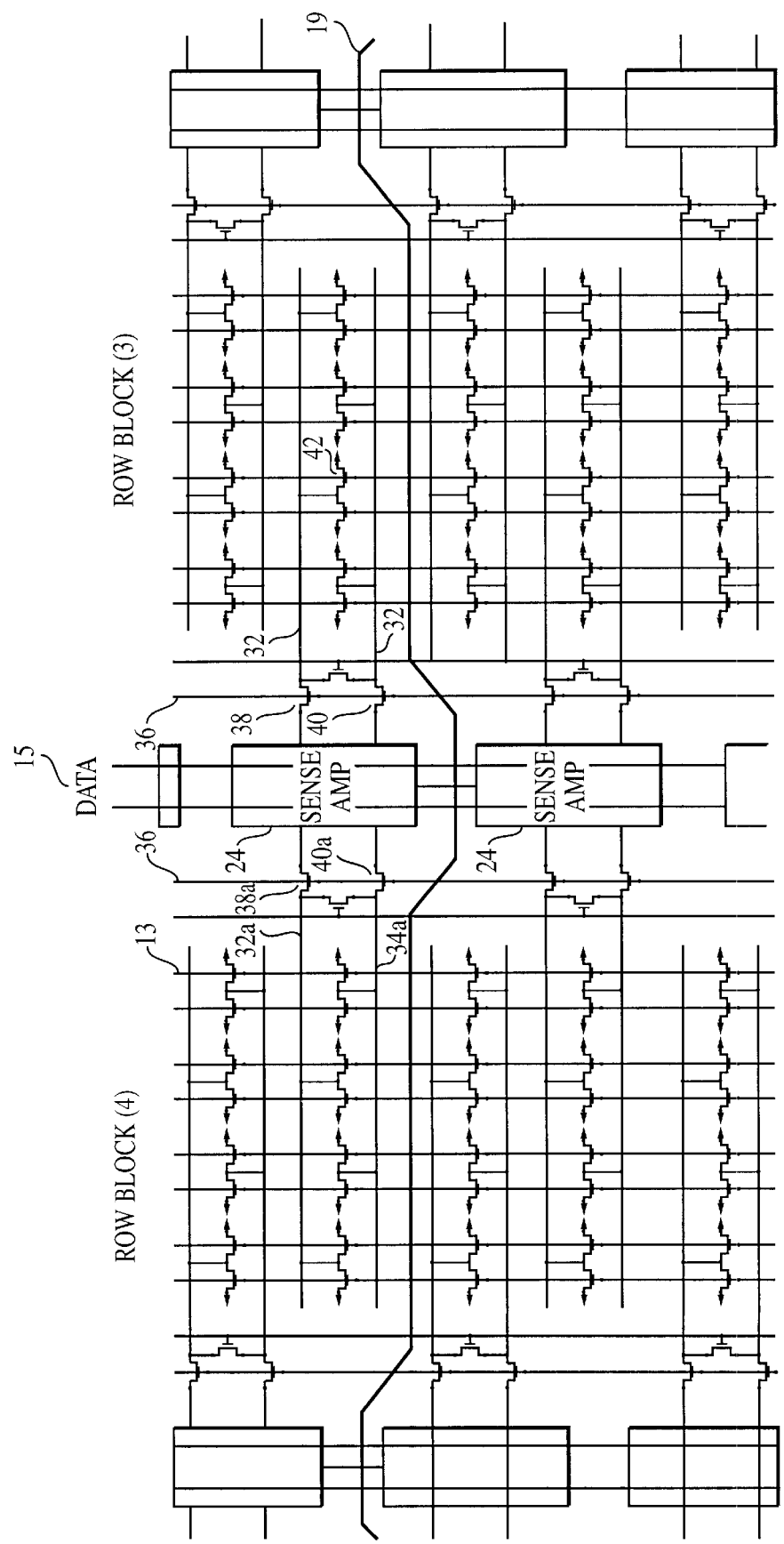
FIG. 3 illustrates a portion of the memory bank from FIG. 1.

The present invention will be described as set forth in the preferred embodiments illustrated in FIGS. 4–8. Other embodiments may be utilized and structural or logical changes may be made without departing from the spirit or scope of the present invention. Like items are referred to by like reference numerals.

In accordance with the present invention, multiple redundant columns are provided that have offset segment boundaries, i.e., a first redundant column is divided into four segments consisting of row block <0,1>, row block <2,3>, row block <4,5> and row block <6,7>, and a second redundant column is divided into four segments consisting of row block <1,2>, row block <3,4>, row block <5,6> and row block <0,7>.

FIG. 4A illustrates an exemplary memory bank 111 of a memory array 100 having multiple redundant columns with offset segmentation boundaries in accordance with the present invention. The architecture of memory bank 111 illustrated in FIG. 4A divides the rows into eight row blocks, numbered row block <0> to row block <7>. It should be understood that the eight row blocks illustrated in FIG. 4A are exemplary only, and a memory device is not limited to eight row blocks. It should also be understood that FIG. 4A illustrates only a portion of a memory device, and that there is a mirror image memory bank of the bank 111 located to the right of column decoder 18 and redundant column decoder 20, as well as additional memory banks.

Memory bank 111 includes a plurality of memory cells arranged in rows and columns. Accessing of a memory cell is similar to that as described with respect to FIG. 1 and will not be repeated here. A first redundant column 22 and a second redundant column 50 having offset segment boundaries with respect to redundant column 22 span the eight row blocks <0> to <7>. It should be noted that while only two redundant columns are depicted, the invention is not so limited as a typical modern high density memory device may have more than two redundant columns and may also be provided with redundant rows as well.

Substitution of one or more of the redundant columns to repair a defective cell in array 100 is accomplished by opening a specific combination of fuses (not shown) or closing antifuses in one of several fuse banks, described with respect to FIG. 5 below, on the die. A selected combination of fuses are blown to provide an address equal to the address of the defective cell as described with respect to FIG. 1. A compare circuit (not shown) compares each incoming address to the blown fuse addresses stored in the fuse banks to determine whether the incoming address matches with one of the blown fuse addresses. If the compare circuit determines a match, then it outputs a match signal (typically one bit). In response thereto, the column decoder 18 is disabled and the redundant column decoder 20 is activated to access one of the redundant columns 22, 50. A plurality of sense amplifiers 24 are provided on either side of each row block to read the data from a selected cell and output it on one of the data lines.

As noted with respect to FIG. 1, the efficiency of the use of redundant columns is increased by segmenting the redundant columns. By segmenting the redundant columns, a defective memory cell in a region of the primary memory array can be repaired with only a portion of the redundant column. In accordance with the present invention, the efficiency is further increased by segmenting the redundant columns with offset boundaries to allow for the repair of any two adjacent row blocks with only one column segment by selecting the appropriate redundant column segment.

Figure 4B:
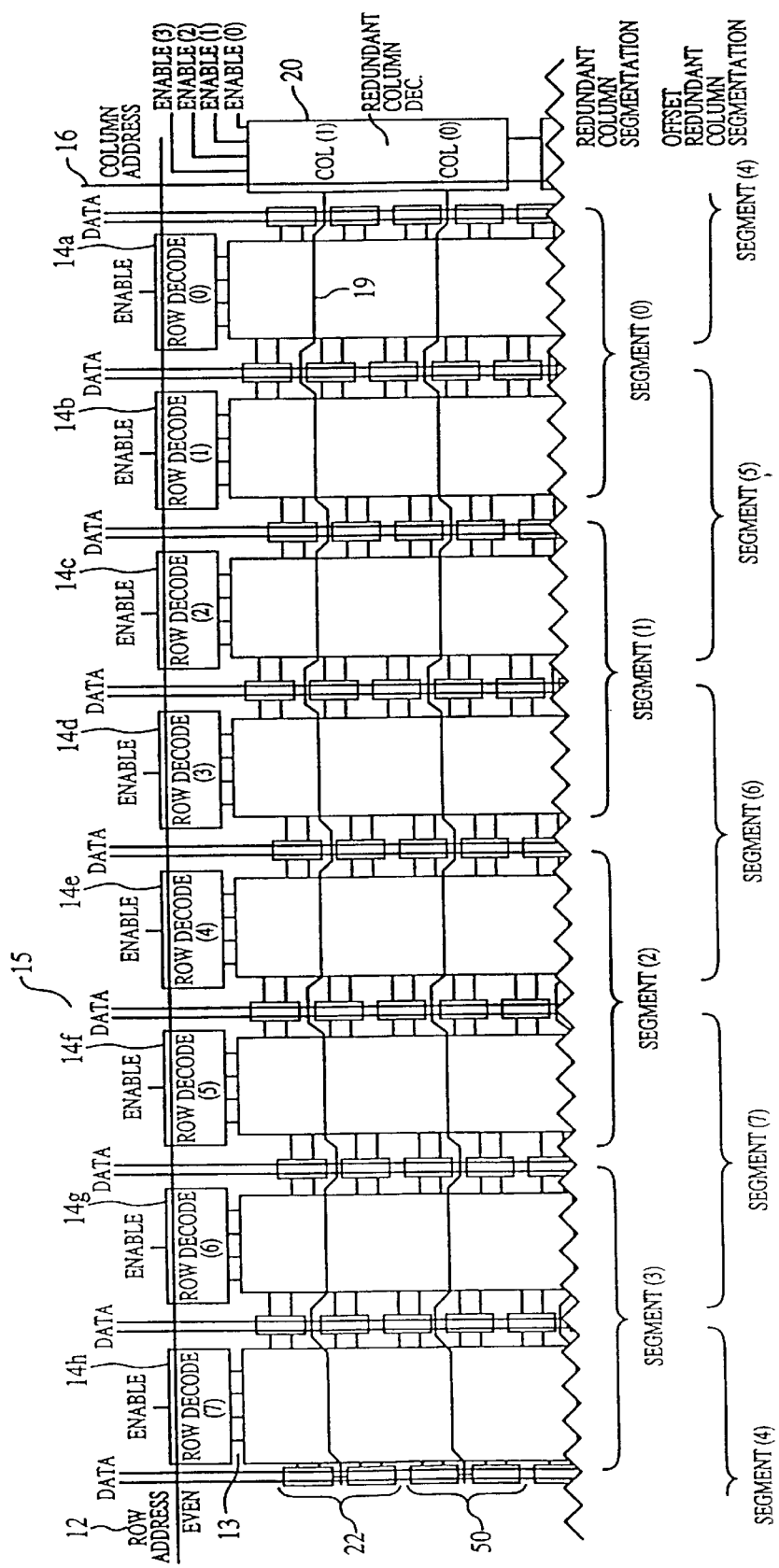
FIG. 4B illustrates the offset segmentation of the redundant columns from the memory device of FIG. 4A in accordance with the present invention.

For example, the redundant column 22 can be segmented into four regions, Segment <0> to Segment <3>, and redundant column 50 can be segmented into four regions, Segment <4> to Segment <7>, that are offset, i.e., span different row block combinations, with respect to the regions of redundant column 22, as illustrated in FIG. 4B. In accordance with a first embodiment, the segmentation of each redundant segment is set in the array. Each of the redundant segments have different segmentation enables such that redundant column 22 would be enabled by row block segments <0,1>, <2,3>, <4,5>, and <6,7> and redundant column 50 would be enabled by row block segments <1,2>, <3,4>, <5,6> and <7,0>. Only one of the segments in the selected redundant column will be selected, determined by which row block is enabled. Typically, the most significant bits (M&Bs) of the row address are used to select one of tie four segments of the redundant column for the comparison by the compare circuit.

Referring back to FIG. 4A, suppose, for example, a memory cell of the primary array located in row block <1> is determined to be defective during testing. If the defective memory cell shares a sense amplifier 24 with cells located in an adjacent row block <0>, then redundant column 22 would be enabled by row block segment <0,1>, and Segment <0> of redundant column 22 would be used to repair the defective cell. If the defective memory cell in row block <1> shares a sense amplifier 24 with cells located in row block <2>, then redundant column 50 would be enabled by row block segment <1,2>, and Segment <5> of redundant column 50 would be used to repair the defective cell. Thus, by offsetting the column segment boundaries in accordance with the present invention, only one segment of a redundant column is used to repair a defective cell that shares a sense amplifier with an adjacent row block located in another segment, instead of having to use two segments as in the prior art. The efficient use of repair segments allows for fewer redundant columns to be placed on the die without compromising the performance of the memory device. Fewer redundant columns results in a reduction in the necessary die area.

Figure 5:
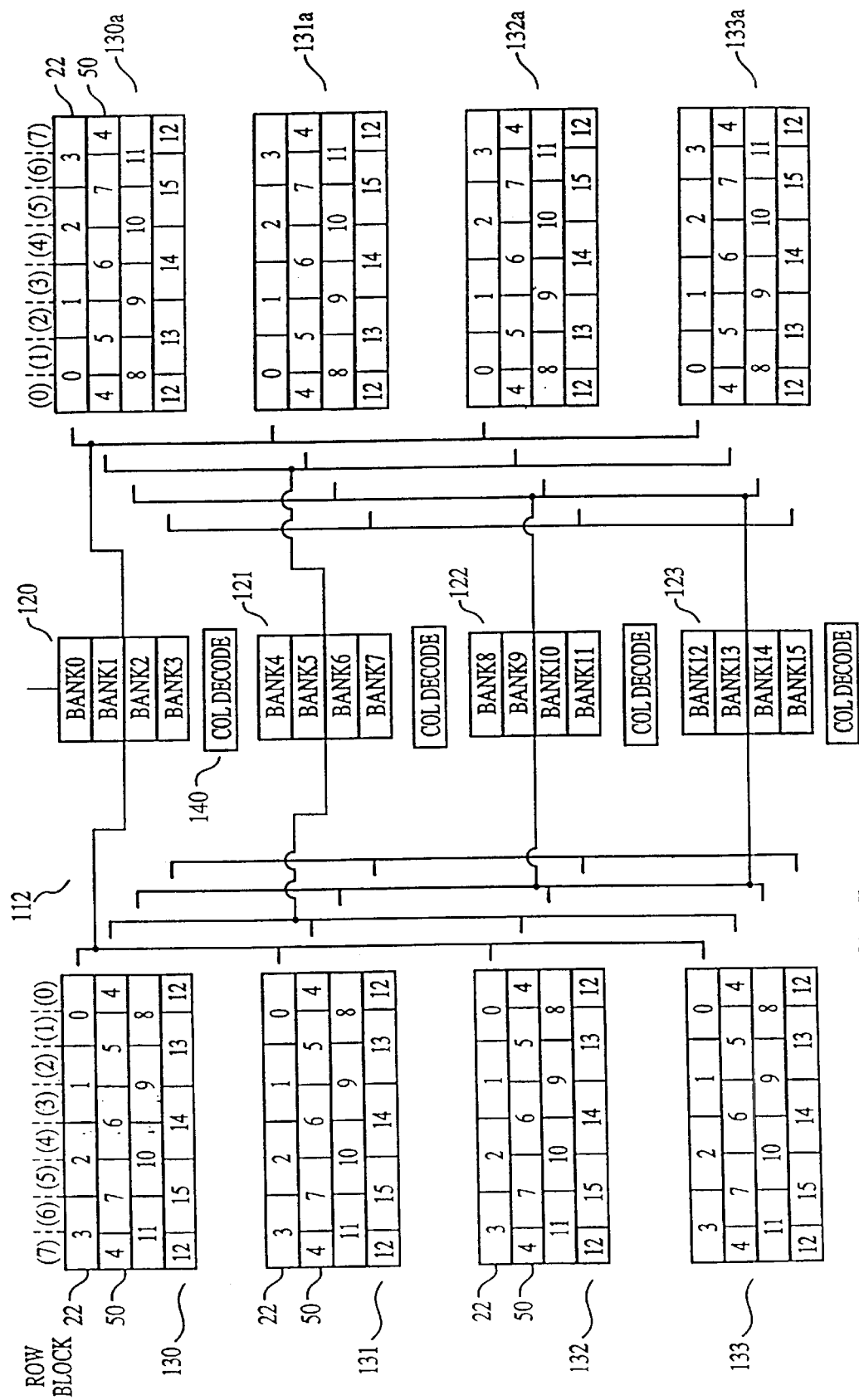
FIG. 5 illustrates in block diagram form fuse banks used to control multiple segments in different parts of an array in accordance with the present invention.

FIG. 5 is a block diagram of a portion of a memory array 112 illustrating how a fuse bank can be used to control multiple redundant segments in different parts of the array in accordance with the present invention. Memory array 112 includes a plurality of memory banks 130–133 and their mirror images 130a–133a, each provided with a plurality of redundant columns 22, 50. The redundant columns are segmented as described with respect to FIG. 4B. Thus for example, redundant segment <0> spans row blocks <0,1>, redundant segment <1>spans row blocks <2,3>, redundant segment <2> spans row blocks <4,5> and redundant segment <3> spans row blocks <6,7> while redundant segment <4> spans row blocks <0,7>, redundant segment <5> spans row blocks <1,2>, redundant segment <6> spans row blocks <3,4> and redundant column <7> spans row blocks <5,6>. Additional redundant columns may be provided as shown, in which redundant segments <8> through <11> span row blocks similar to that as redundant segments <0> through <1>, and redundant segments <12> through <16> span pan row blocks similar to that as redundant segments <4> through <7>.

Each memory bank 130–133 and 130a–133a is connected to one or more fuse banks 120–123. Each fuse bank 120–123 is provided with four separate fuse banks, BANK0 to BANK3 for fuse bank 120, BANK4 to BANK7 for fuse bank 121, BANK8 to BANK11 for fuse bank 122 and BANK12 to BANK15 for fuse bank 123. BANK0 is used to control segment <0>, BANK1 used to control segment <1>, BANK2 used to control segment <2> and so forth up to BANK15, regardless of where the respective segment controlled by each bank is located in the array 112. Thus, for example, fuse bank BANK0 can be used to select segment <0> in any bank 130–133 or 130a–133a.

Figure 6:
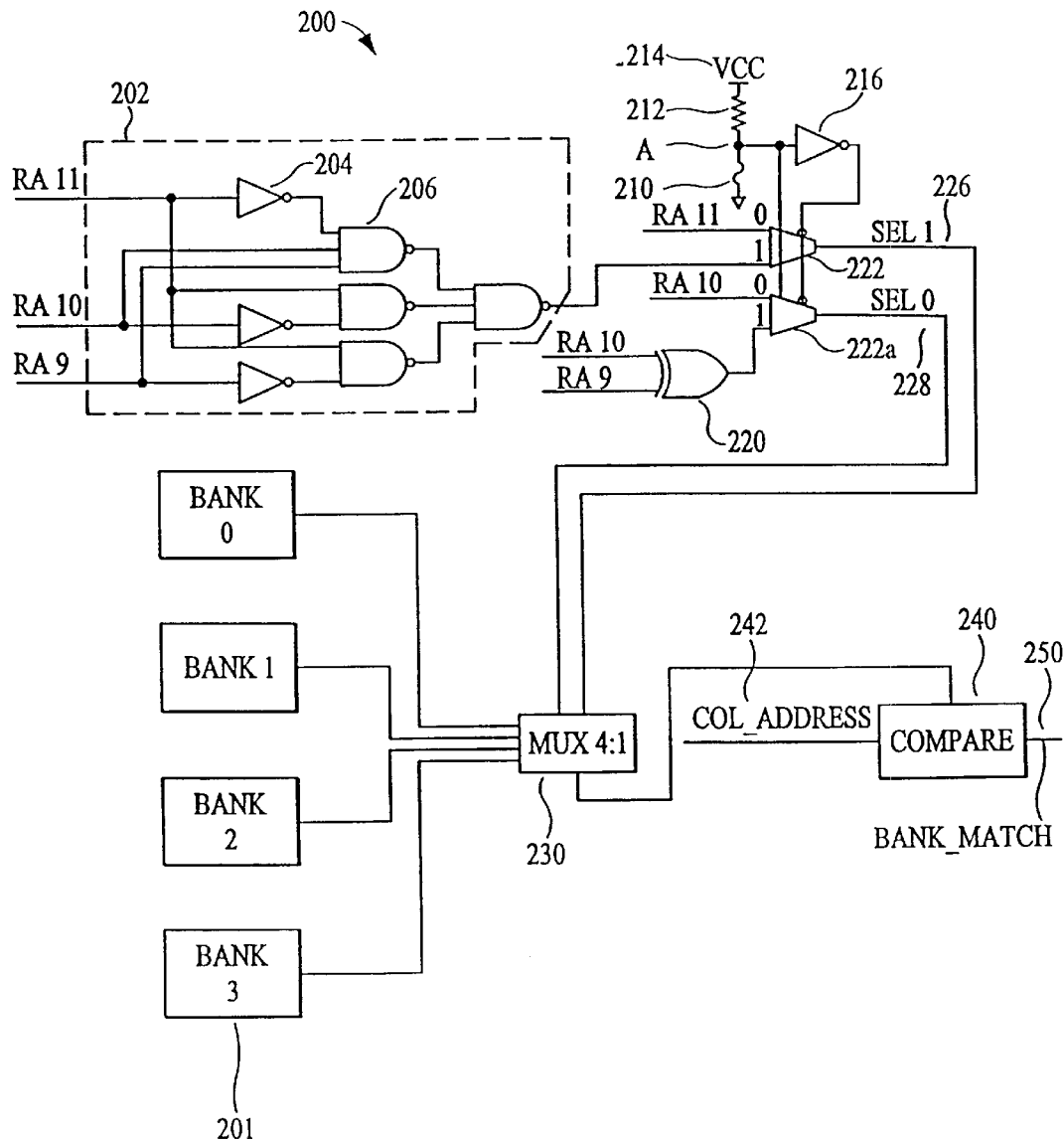
FIG. 6 illustrates a circuit for selectively setting the segmentation of a redundant column in accordance with a second embodiment of the present invention.

FIG. 6 illustrates a circuit 200 for selectively setting the segmentation of a redundant column in accordance with a second embodiment of the present invention, i.e., activating a redundant column that has segmentation boundaries for row blocks <0,1>, <2,3>, <4,5> and <6,7> or row blocks <0,7>, <1,2>, <3,4>, and <5,6>.

Circuit 200 includes logic circuitry 202 which consists of inverters 204 and NAND gates 206. The row address MSBs, i.e., RA9, RA10 and RA11 are input to logic circuitry 202. The output from the logic circuit 202 is connected to input pin 1 of a two-to-one multiplexer 222. Row address MSB RA11 is connected to input pin 0 of multiplexer 222. Row address MSBs RA10 and RA9 are input to an Exclusive-OR (XOR) gate 220, and the output of XOR gate 220 is connected to input pin 1 of a second multiplexer 222a. Row address MSB RA10 is connected to input pin 0 of multiplexer 222a. A programmable element, such as for example fuse 210, is used to program the segmentation of a redundant column as described below. One side of fuse 210 is connected to a resistor 212 at node A, and the other side of fuse 210 is connected to ground. Resistor 212 is connected to Vcc 214. Node A is connected to the input of inverter 216 and also to a first enable pin of mulitplexers 222, 222a. The output of inverter 216 is connected to a second enable pin of multiplexers 222, 222a. The outputs SEL1 and SEL0 from multiplexers 222, 222a are input to a four-to-one multiplexer 230, which is connected to each bank BANK0 to BANK3 201. The output from multiplexer 230 is input to compare circuit 240.

Figure 7:
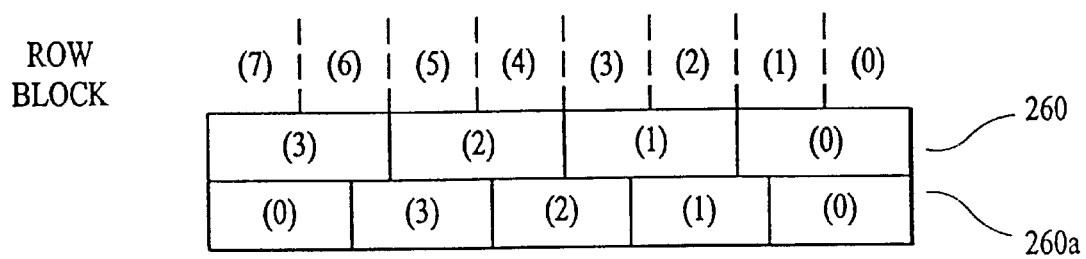
FIG. 7 illustrates redundant columns having segmentation set by the circuit of FIG. 6.

The operation of circuit 200 is as follows. The state of fuse 210, i.e., whether it is opened or closed, is used to program the boundaries across the row blocks <0> to <7> for segments <0> to <3> of a redundant column. Thus, for example, as illustrated in FIG. 7, a redundant column 260 could be segmented such that the segments <0>, <1>, <2> and <3> of the redundant column are set to include row blocks <0,1>, <2, 3>, <4,5>, and <6,7> respectively, while a second redundant column 260a could be segmented such that the segments are set to include row blocks <0,7>, <1, 2>, <3, 4>, and <5,6> respectively.

Suppose, for example, fuse 210 is not blown. Circuit 200 will be programmed for a normal segmentation, such as redundant column 260 of FIG. 7. When fuse 210 is not blown, a low signal will be input to inverter 216 and the first enable pins of multiplexers 222 and 222a. The output from inverter 216 and input to the second enable pins of multiplexers 222, 222a will be high. The low input on the first enable pin and the high input on the second enable pin will cause multiplexers 222, 222a to enable input pin 0. The row address MSBs RA9, RA10 and RA11 are used to determine which segment of the redundant column will be selected as follows. The row address MSBs define which row block <0> to <7> is being activated by the three bit binary number from RA11, RA10 and RA9 as follows:

| RA11 | RA10 | RA9 | Row Block |
|------|------|-----|-----------|
| 0 | 0 | 0 | <0> |
| 0 | 0 | 1 | <1> |
| 0 | 1 | 0 | <2> |
| 0 | 1 | 1 | <3> |
| 1 | 0 | 0 | <4> |

-continued

| RA11 | RA10 | RA9 | Row Block |
|------|------|-----|-----------|
| 1 | 0 | 1 | <5> |
| 1 | 1 | 0 | <6> |
| 1 | 1 | 1 | <7> |

Referring again to FIG. 7, each row block corresponds to a specific segment in the redundant column 260. As shown, row blocks <0> and <1> correspond to segment <0> of the redundant column 260, row blocks <2> and <3> correspond to segment <1>, row blocks <4> and <5> correspond to segment <2>, and row blocks <6> and <7> correspond to segment <3>. The two bit signal formed by outputs SEL1 226 and SEL0 228 of multiplexers 222, 222a provide the signal to multiplexer 230 to indicate the appropriate segment based on the row address MSBs RA11, RA10 and RA9 according to the following table:

| RA11 | RA10 | RA9 | Row Block | SEL1 | SEL0 | Segment |
|------|------|-----|-----------|------|------|---------|
| 0 | 0 | 0 | <0> | 0 | 0 | <0> |
| 0 | 0 | 1 | <1> | 0 | 0 | <0> |
| 0 | 1 | 0 | <2> | 0 | 1 | <1> |
| 0 | 1 | 1 | <3> | 0 | 1 | <1> |
| 1 | 0 | 0 | <4> | 1 | 0 | <2> |
| 1 | 0 | 1 | <5> | 1 | 0 | <2> |
| 1 | 1 | 0 | <6> | 1 | 1 | <3> |
| 1 | 1 | 1 | <7> | 1 | 1 | <3> |

Thus, for example, when the row address MSBs indicate that row block <0> or <1> is being selected, the outputs 226, 228 will be 0,0, indicating segment <0> of redundant column 260 should be selected for substitution. If for example, row block <6> or <7> is being selected, the outputs 226, 228 will be 1,1, indicating segment <3> of redundant column 260 should be selected for substitution. Based on the segment of redundant column 260 selected for substitution, multiplexer 230 will output to compare circuit 240 only one of the addresses stored by fuse banks 201 for comparison with the incoming address 242. If the compare circuit 240 determines a match, then it outputs a match signal (typically one bit) on output 250. In response thereto, the column decoder controlling the primary array is disabled and the redundant column decoder for redundant column 260 is activated to access the appropriate segment of redundant column 260.

Now suppose, for example, fuse 210 is blown. Circuit 200 will be programmed for an offset segmentation, such as redundant column 260a of FIG. 7. When fuse 210 is blown, a high signal will be input to inverter 216 and the first enable pins of multiplexers 222 and 222a. The output from inverter 216 and input to the second enable pins of multiplexers 222, 222a will be low. The high input on the first enable pin and the low input on the second enable pin will cause multiplexers 222, 222a to enable input pin 1. The row address MSBs RA9, RA10 and RA11 are used to determine which segment of the redundant column will be selected as follows. As previously noted, the row address MSBs define which row block <0> to <7> is being activated by the three bit binary number from RA11, RA10 and RA9 as follows:

| RA11 | RA10 | RA9 | Row Block |
|------|------|-----|-----------|
| 0 | 0 | 0 | <0> |
| 0 | 0 | 1 | <1> |
| 0 | 1 | 0 | <2> |
| 0 | 1 | 1 | <3> |
| 1 | 0 | 0 | <4> |
| 1 | 0 | 1 | <5> |
| 1 | 1 | 0 | <6> |
| 1 | 1 | 1 | <7> |

Referring again to FIG. 7, each row block corresponds to a specific segment in the offset redundant column 260a. As shown, row blocks <0> and <7> correspond to segment <0> of the offset redundant column 260a, row blocks <1> and <2> correspond to segment <1>, row blocks <3> and <4> correspond to segment <2>, and row blocks <5> and <6> correspond to segment <3>. The two bit signal formed by outputs SEL1 226 and SEL0 228 of multiplexers 222, 222a provide the signal to multiplexer 230 to indicate the appropriate segment based on the row address MSBs RA11, RA10 and RA9 according to the following table:

| RA11 | RA10 | RA9 | Row Block | SEL1 | SEL0 | Segment |
|------|------|-----|-----------|------|------|---------|
| 0 | 0 | 0 | <0> | 0 | 0 | <0> |
| 0 | 0 | 1 | <1> | 0 | 1 | <1> |
| 0 | 1 | 0 | <2> | 0 | 1 | <1> |
| 0 | 1 | 1 | <3> | 1 | 0 | <2> |
| 1 | 0 | 0 | <4> | 1 | 0 | <2> |
| 1 | 0 | 1 | <5> | 1 | 1 | <3> |
| 1 | 1 | 0 | <6> | 1 | 1 | <3> |
| 1 | 1 | 1 | <7> | 0 | 0 | <0> |

Thus, for example, when the row address MSBs indicate that row block <0> or <7> is being selected, the outputs 226, 228 will be 0,0, indicating segment <0> of offset redundant column 260a should be selected for substitution. If for example, row block <1> or <2> is being selected, the outputs 226, 228 will be 0,1, indicating segment <1> of offset redundant column 260a should be selected for substitution. Based on the segment of offset redundant column 260a selected for substitution, multiplexer 230 will output to compare circuit 240 only one of the addresses stored by fuse banks 201 for comparison with the incoming address 242. If the compare circuit 240 determines a match, then it outputs a match signal (typically one bit) on output 250. In response thereto, the column decoder controlling the primary array is disabled and the redundant column decoder for offset redundant column 260a is activated to access the appropriate segment of offset redundant column 260a.

Figure 8:
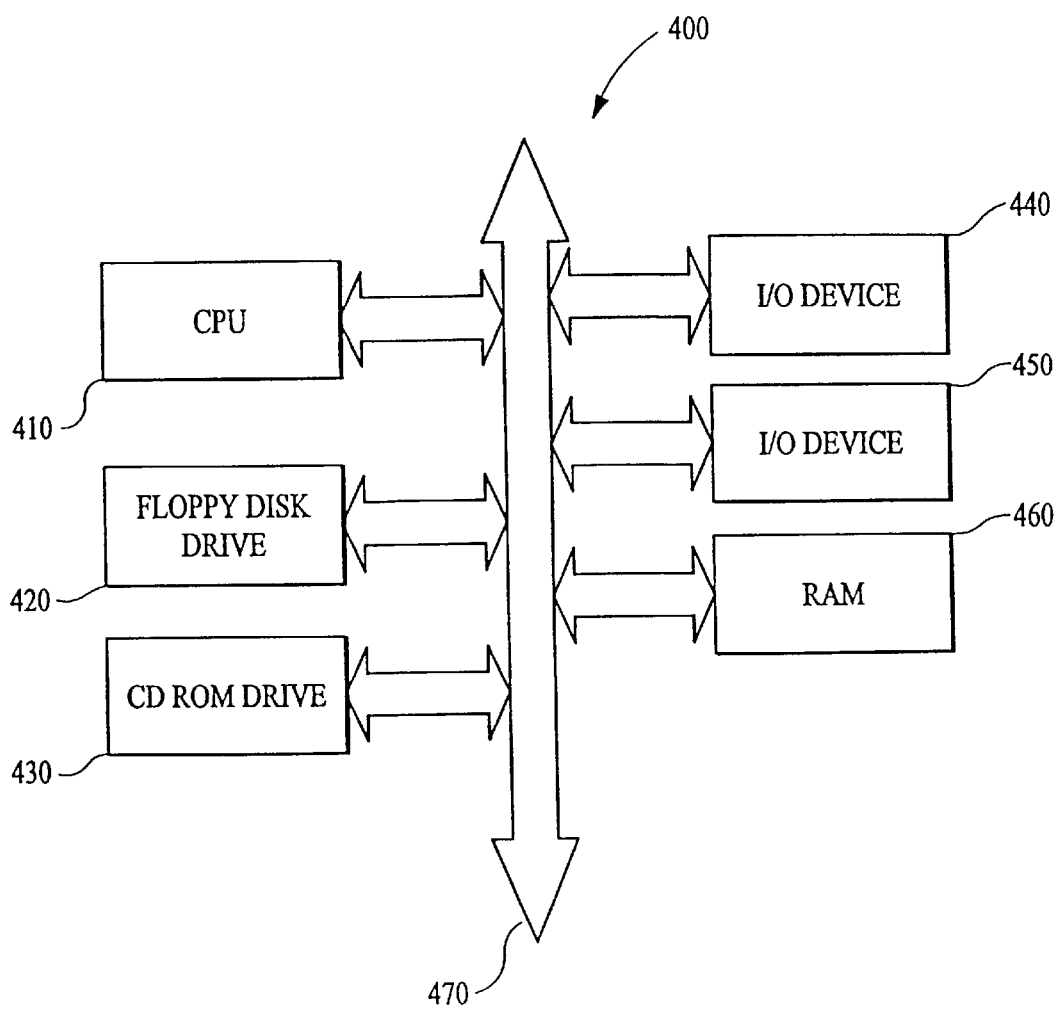
FIG. 8 illustrates in block diagram form a processor system in which a memory device in accordance with the present invention can be used.

A typical processor based system which includes a memory device according to the present invention is illustrated generally at 400 in FIG. 8. A computer system is exemplary of a system having digital circuits which include memory devices. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 410, for example, a microprocessor, that communicates with one or more input/output (I/O) devices 440, 450 over a bus 470. The computer system 400 also includes random access memory (RAM) 460, and, in the case of a computer system may include peripheral devices such as a floppy disk drive 420 and a compact disk (CD) ROM drive 430 which also communicate with CPU 410 over the bus 470. RAM 460 is preferably constructed as an integrated circuit which includes multiple redundant columns having offset segmentation boundaries as previously described with respect to FIGS. 4–7. It may also be desirable to integrate the processor 410 and memory 460 on a single IC chip.

Thus, in accordance with the present invention, a memory device is provided with a segmented column architecture that allows for single bank repair across any two row blocks. By offsetting the segment boundaries, the repair of the memory device can be optimized by repairing any two adjacent row blocks with only one column segment by selecting the appropriate redundant column segment.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A memory repair system comprising:
   a substrate; and
   first and second redundant column lines disposed above said substrate, said first redundant column line having a longitudinal axis, said first column line adapted to be programmably segmented into first and second segments, said first and second segments having a first segmentation boundary therebetween, said second column line adapted to be programmably segmented into third and fourth segments, said third and fourth segments having a second segmentation boundary therebetween, a first portion of said first segment being disposed adjacent a second portion of said third segment, and said first and second segmentation boundaries being spatially offset from one another in a direction of said longitudinal axis.

2. A memory device comprising:
   a substrate including a plurality of row lines;
   a first redundant column line disposed on said substrate substantially normal to each of said plurality of row lines, said first column line having first and second programmable segmentation points defining a first programmable segment therebetween, such that said first segmentation point is adjacent one of said plurality of row lines; and
   a second redundant column line disposed on the substrate substantially normal to each of said plurality of row lines, said second redundant column line being spatially disposed substantially parallel to said first redundant column line, said second column line having third and fourth programmable segmentation points defining a second programmable segment therebetween, such that neither said third segmentation point nor said fourth segmentation point is adjacent said one of said plurality of row lines, said second segment spanning said one of said plurality of row lines.

3. A method of repairing a memory device having first and second defective memory cells, said first and second cells operatively connected to a single sense amplifier, said sense amplifier having a plurality of memory cells connected thereto, said method comprising:

locating said defective first and second memory cells in said memory device;

identifying said single sense amplifier switchingly connected to both of said defective memory cells;

programming a segment of a redundant column line such that said programmed segment spans all memory cells connected to said identified sense amplifier; and repairing out said defective memory cell with said programmed segment.

4. A method according to claim 3, wherein said sense amplifier is one of a plurality of sense amplifiers, said memory device including at least two redundant column segments spanning each of said memory cells.

5. A method according to claim 4, wherein said programming further comprises selecting one of said at least two redundant column segments, said one selected column segment spanning a region spatially disposed between said first and second defective memory cells.

6. A method according to claim 4, wherein said at least two redundant column segments are spatially offset from one another.

7. A method according to claim 4, wherein said programming further comprises opening a fuse to identify a location of said first memory cell.

8. A method according to claim 4, further comprising:

defining first and second ends of said programmed segment; and defining a logical address corresponding to said programmed segment.

* * * * *